(12) United States Patent
Sun et al.

(10) Patent No.: US 7,364,832 B2
(45) Date of Patent: Apr. 29, 2008

(54) WET DEVELOPABLE HARD MASK IN CONJUNCTION WITH THIN PHOTORESIST FOR MICRO PHOTOLITHOGRAPHY

(75) Inventors: Sam X. Sun, Rolla, MO (US); Chenghong Li, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 10/864,787

(22) Filed: Jun. 8, 2004

(65) Prior Publication Data
US 2005/0074699 A1 Apr. 7, 2005

Related U.S. Application Data

(60) Provisional application No. 60/477,580, filed on Jun. 11, 2003.

(51) Int. Cl.
*G03F 7/26* (2006.01)
(52) U.S. Cl. .................... 430/273.1; 430/313
(58) Field of Classification Search ............... 430/312, 430/273.1, 327
See application file for complete search history.

(56) References Cited

U.S. PATENT DOCUMENTS

| 5,091,047 A | 2/1992 | Cleeves et al. ............. 438/704 |
| 5,106,718 A * | 4/1992 | Bartmann et al. ........... 430/191 |
| 6,020,269 A | 2/2000 | Wang et al. ................ 438/717 |
| 6,127,070 A | 10/2000 | Yang et al. .................... 430/5 |
| 6,136,679 A * | 10/2000 | Yu et al. ..................... 438/592 |
| 6,156,658 A | 12/2000 | Wang et al. ................ 438/688 |
| 6,165,695 A | 12/2000 | Yang et al. ................. 430/314 |
| 6,171,763 B1 | 1/2001 | Wang et al. ................ 438/318 |
| 6,200,907 B1 | 3/2001 | Wang et al. ................ 438/718 |
| 6,218,292 B1 * | 4/2001 | Foote ......................... 438/636 |
| 6,306,560 B1 | 10/2001 | Wang et al. ................ 430/316 |
| 6,309,926 B1 | 10/2001 | Bell et al. ................... 438/257 |
| 6,440,640 B1 | 8/2002 | Yang et al. ................. 430/314 |
| 6,509,137 B1 | 1/2003 | Wang et al. ................ 430/312 |
| 6,740,469 B2 * | 5/2004 | Krishnamurthy et al. 430/270.1 |
| 6,844,131 B2 * | 1/2005 | Oberlander et al. ..... 430/270.1 |
| 7,074,527 B2 | 7/2006 | Lu et al. |
| 7,265,431 B2 | 9/2007 | Sivakumar .................. 257/437 |
| 2003/0040179 A1 | 2/2003 | Thakar et al. ............. 438/689 |
| 2003/0129531 A1 | 7/2003 | Oberlander et al. ..... 430/271.1 |
| 2003/0129547 A1 | 7/2003 | Neisser et al. ............. 430/322 |

* cited by examiner

*Primary Examiner*—Kathleen Duda
(74) *Attorney, Agent, or Firm*—Hovey Williams LLP

(57) ABSTRACT

A novel process for using a hard mask or protective layer in conjunction with an extremely thin photoresist is provided. In this process, a thin film of the protective layer is coated on the surface of a substrate that is to be selectively modified by reactive ion etch (RIE). The protective layer is photosensitive and anti-reflective. An extremely thin photoresist layer is coated on top of the protective layer. The stack of the films is selectively exposed to actinic radiation at a wavelength determined by the sensitivities of the protective layer and photoresist layer. The latent images on the photoresist and protective layers resulting from the exposure are developed with a common alkaline developer. The three dimensional patterns of photoresist and underlying protective layer are formed simultaneously by the single exposure and single development. When the underlying substrate is etched by RIE, the protective layer is the masking layer, not the photoresist.

20 Claims, 4 Drawing Sheets

WET DEVELOPABLE HARD MASK IN CONJUNCTION WITH THIN PHOTORESIST FOR MICRO PHOTOLITHOGRAPHY

RELATED APPLICATIONS

This application claims the priority benefit of a provisional application entitled ENHANCED MICROPHOTOLITHOGRAPHY PERFORMANCE WITH THIN PHOTORESISTS AND WET-DEVELOPABLE, PHOTOSENSITIVE ANTI-REFLECTIVE HARD MASKS, Ser. No. 60/477,580, filed Jun. 11, 2003, incorporated by reference herein.

BACKGROUND OF THE INVENTION

1. Field of the Invention

The present invention is broadly directed towards new methods of forming microelectronic structures where extremely thin photoresists layers can be utilized.

2. Description of the Prior Art

When a photoresist is used to generate patterns by light exposure, Rayleigh's laws can be used to define the pattern resolution and depth of focus (DOF):

$$\text{Resolution} = k_1 \lambda/NA; \text{ and}$$

$$DOF = k_2 \lambda/NA^2,$$

where $\lambda$ is the irradiation wavelength, NA is the numerical aperture of the exposure tool, and $k_1$ and $k_2$ are constants for a given process. Rayleigh's theory indicates that an exposure tool with short wavelength and large numerical aperture will produce better pattern resolution. This principle is why the microelectronics industry has been progressively moving toward short exposure wavelengths. However, Rayleigh's law also shows that enhancing resolution causes the DOF to decrease.

The use of a thin photoresist decreases the value of $k_1$ and increases the value of $k_2$, which results in better resolution and a large DOF. As a result, extensive research has been conducted in an attempt to reduce photoresist thicknesses in photolithographic processes. Due to the different etch selectivities (with the different etch chemistries) of the hard mask over the photoresist, and of the hard mask over the substrate, the most effective way to reduce photoresist thickness is by introducing a hard mask into the etch stack.

Silicon nitride, silicon oxynitride, silicon nitride/oxide, silicon oxide/nitride, transition metals, amorphous silicon, and metal/oxide hard masks have been introduced into the etch stack to attempt to decrease the necessary photoresist thickness in photolithographic processes. The hard mask-to-photoresist etch selectivity for a given thickness of the hard mask determines how thin the photoresist can be. Unfortunately, organic photoresists etch relatively fast under common hard mask plasma etch chemistries and conditions. Thus, the photoresist thickness is still substantial even with multiple hard masks.

A multilayer or composite photoresist process has also been attempted. In this process, a somewhat thinner photoresist layer is formed on a substrate and is subsequently exposed and developed to pattern the photoresist. The process is repeated until the desired number of photoresist layers are accumulated. The thinner each layer is, the more layers that must be processed for a specific final thickness. The drawbacks of this process are as clear as the advantages. In particular, the procedure is cumbersome, and the patterns for each photoresist layer must be perfectly aligned.

There is a need for a process that minimizes or even eliminates these problems.

SUMMARY OF THE INVENTION

The advanced hard mask and process of the present invention minimize, and more preferably eliminate, the problems described above. In one aspect, the invention is broadly concerned with a method of forming structures to be used in various microelectronic applications such as photolithographic processes for integrated circuit (IC) fabrication and microelectromechanical systems (MEMS) applications.

In more detail, the methods comprise initially applying via any known method (e.g., spin coating) a protective or hard mask layer to a substrate. Exemplary substrates include those selected from the group consisting of silicon, polysilicon, silicon oxide, silicon nitride, silicon oxynitride, gallium arsenide, aluminum, tungsten, titanium, titanium-tungsten, nickel, copper, and gold substrates. The protective layer may be applied directly to the substrate surface, or to one or more intermediate layers (e.g., planarizing layers, additional hard mask layer(s)) that are first applied to the substrate surface. Regardless, the substrate can be a planar surface, or it can include topography (via holes, contact holes, raised features, etc.).

After the protective layer is applied, it is preferably subjected to a curing step by heating at a temperature of from about 130-250° C., and more preferably from about 180-210° C. The thickness of the protective layer after baking is preferably from about 20-150 nm, more preferably from about 40-100 nm, and even more preferably from about 40-80 nm.

The protective layer is preferably wet developable. That is, the cured composition can be removed with conventional aqueous developers such as tetramethyl ammonium hydroxide (TMAH) and KOH developers. Some of these developers are commercialized under the tradenames MF-319 (available from Shipley, Mass.), MF-320 (available from Shipley), and NMD3 (available from TOK, Japan) developers. At least about 95%, and preferably at least about 99% of the inventive coatings will be removed by a base developer such as tetramethyl ammonium hydroxide and KOH developers.

Wet-developable layers in photolithographic processes are prone to pattern undercut due to the isotropic nature of wet development. In the present invention, the undercut issue is resolved by making the protective layer photosensitive. Thus, a pattern can be defined in the protective layer when it is exposed to at least about 1 mJ/cm$^2$.

The protective layer preferably possesses light absorbing properties. Specifically, the protective layer used in the inventive methods will have a k value (the imaginary component of the complex index of refraction) of at least about 0, preferably at least about 0.1, and more preferably from about 0.2-0.5, and an n value (the real component of the complex index of refraction) of at least about 1.2, and preferably from about 1.6-1.8. These values can be obtained at a wide range of wavelengths, including wavelengths of less than about 500 nm (e.g., 436 nm, 365 nm, 248 nm, 193 nm, 157 nm, 13 nm, 11 nm, 4 nm, and X-ray).

The protective layer should also have a high etch selectivity over the substrate to provide an adequate plasma barrier. This is because the photoresist layer in this process is used for patterning the protective layer by exposure and wet development only, whereas the photoresist functions as a plasma-etch barrier as well in conventional processes. Thus, the etch selectivity of the protective layer over the substrate (e.g., polysilicon) will be at least about 1, preferably at least about 5, and more preferably from about 10-200, when chlorine or HBr is used as the etchant. Furthermore, the etch selectivity of the protective layer over the photoresist (e.g., a 193-nm photoresist) will be at least about 1, preferably at least about 5, and more preferably from about 10-100, when chlorine or oxygen is used as the etchant. The protective layer should etch at a rate of less than about 5 nm/second, and more preferably from about 0.02-1 nm/second, when chlorine or HBr is the etchant.

After the protective layer is applied, a photoresist can then be applied to the protective layer followed by baking at a temperature of from about 90-180° C., and more preferably from about 90-130° C. Advantageously, the photoresist can be used as a much thinner layer than was the case with prior art processes. The photoresist thickness after baking will be less than about 150 nm, preferably from about 20-100 nm, and even more preferably from about 20-60 nm. This small photoresist thickness is possible due to the presence of the protective layer having the properties defined above. As a result, a photoresist composition having a solids content (prior to baking) of less than about 5% by weight, and more preferably from about 1.5-3.0% by weight, can be used. Such a photoresist can be specifically prepared for this purpose, or a commercially available photoresist can be diluted until the desired solids content is achieved.

The photoresist can then be exposed and developed. Following the methods of the invention will yield precursor structures for line/space, dual damascene, and other microlithographic processes which have the foregoing desirable properties.

DETAILED DESCRIPTION OF THE PREFERRED EMBODIMENTS

Figure 1A:
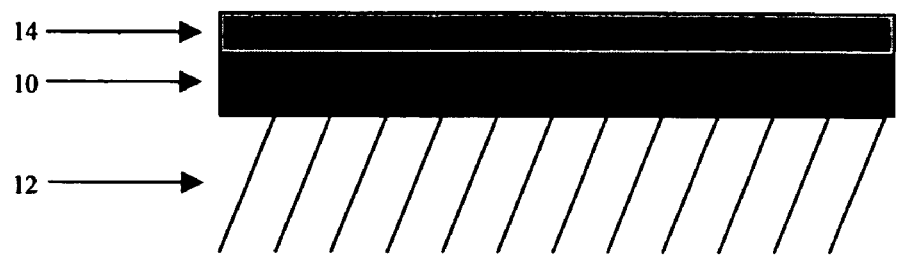
FIGS. 1a-1d are schematic drawings depicting a structure formed by the inventive process.

In more detail, FIGS. 1a-1d illustrate the stack of layers for the inventive photolithographic process. Referring to FIG. 1a, a photosensitive and anti-reflective hard mask or protective layer 10 is spin coated onto the substrate 12 at a thickness of from about 20-150 nm, depending upon its etch selectivity over the substrate, substrate etch depth, and its optical properties (e.g., refractive index, extinction coefficient). The protective layer is preferably subsequently cured by baking on a hot plate. A thin photoresist layer 14, positive-working or negative-working depending on the tone of the underlying protective layer, is then spin coated on top of the protective layer at a thicknesses described above.

Figure 1B:
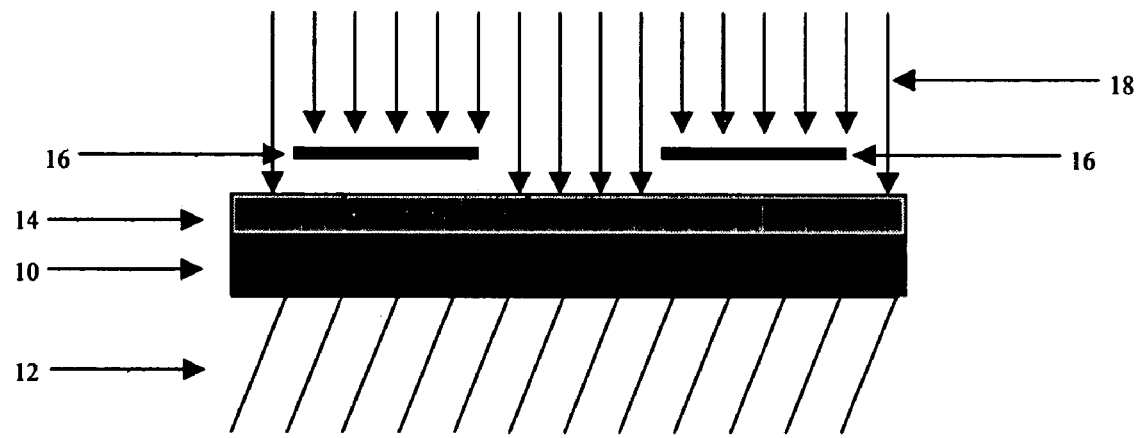
Figure 1C:
Figure 1D:
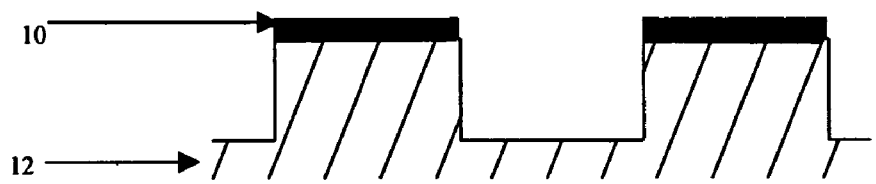

In FIG. 1b, patterns on a photomask 16 are transferred onto the thin photoresist layer 14 by irradiation 18. As demonstrated in FIG. 1c, the patterns are then transferred to the protective layer 10 by development (preferably simultaneously) with the photoresist layer 14 by an alkaline developer. Finally, the substrate 12 is plasma etched through the patterned protective layer 14 (FIG. 1d).

The photolithographic process can be used with any microelectronic substrates. Furthermore, the process can be used in MEMS applications or in conjunction with organic dielectric layers, planarization layer, and metal layers to be etched for patterns or structures through the wet-developable protective layer and thin resist.

The protective layer-thin photoresist process can be used in the ion implant process for IC fabrication as well. The stack of layers in the ion implant process is the same as demonstrated in FIG. 1a. When the substrate is implanted with boron, phosphorous, arsenic, or any other elements, the patterned protective layer serves as an ion barrier.

In one preferred embodiment, the protective layer may comprise any combination of a polymeric metal alkoxide, polymer binder, polyols, chromophore (e.g., cyano acrylate, 9-anthracenecarboxylic acid, and 4-hydroxybenzoic acid), photo acid generator (PAG, e.g., TAZ-108™), photo initiator (e.g., Irgacure 184™), and organic solvents. Some particularly preferred compositions are disclosed in U.S. patent application Ser. No. 10/180,625, filed Jun. 25, 2002, and incorporated by reference herein.

In one embodiment, preferred protective layer compositions comprise polymers that include recurring units having the formula

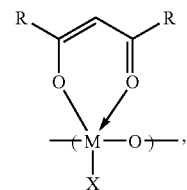

wherein X is selected from the group consisting of light-attenuating moieties and polyols, M is a metal, and each R is individually selected from the group consisting of hydrogen, alkyls (preferably $C_1$-$C_8$), aryls, alkoxys, and phenoxys. The most preferred R groups are —$CH_3$ and —$OC_2H_5$.

The most preferred metals are Ti, Zr, Si, and/or Al. It is also preferred that the light-attenuating moiety include a functional group for coordinating with the metal atom of the polymeric metal alkoxide. Such functional groups include carbonyl, alcohol, and phenol groups. Furthermore, the moiety (i.e., X) is preferably present in the polymer at a level of from about 2-50% by weight, and more preferably from about 2-25% by weight, based upon the total weight of the polymer taken as 100% by weight. Suitable light-attenuating moieties include those selected from the group consisting of moieties of trimethylol ethoxylate, 4-hydroxybenzaldehyde, and 2-cyano-3-(4-hydroxyphenyl)-acrylic acid ethyl ester.

The preferred composition is formed by simply dispersing or dissolving the polymers in a suitable solvent system, preferably at ambient conditions and for a sufficient amount of time to form a substantially homogeneous dispersion. The polymer should be present in the composition at a level of 2-50% by weight, more preferably from about 5-30% by weight, and more preferably from about 7-15% by weight, based upon the total weight of solids in the composition taken as 100% by weight.

Preferred solvent systems include a solvent selected from the group consisting of propylene glycol methyl ether acetate (PGMEA), propylene glycol methyl ether (PGME), propylene glycol n-propyl ether (PnP), ethyl lactate, and mixtures thereof. Preferably, the solvent system has a boiling point of from about 50-250° C., and more preferably from about 100-175° C. The solvent system should be utilized at a level of from about 70-95% by weight, and preferably from about 80-90% by weight, based upon the total weight of the solids in the composition taken as 100% by weight.

Any additional ingredients are also preferably dispersed in the solvent system along with the polymer. One such preferred additional ingredient is a second polymer or polymer binder such as those selected from the group consisting of epoxy novolac resins (e.g., Epon 164®, available from Araldite), acrylates (e.g., poly(glycidyl methacrylate)), polymerized aminoplasts (e.g., Cymel® products available from Cytec Industries), glycourils (e.g., Powderlink® products available from Cytec Industries), vinyl ethers, and mixtures thereof. The weight average molecular weight of this additional polymer is preferably from about 1,000-50,000 Daltons, and more preferably from about 5,000-25,000 Daltons. In embodiments where an additional polymer is utilized, the composition should comprise from about 1-50% by weight of this additional polymer, and more preferably from about 5-25% by weight, based upon. the total weight of the solids in the composition taken as 100% by weight.

It will be appreciated that a number of other optional ingredients can be included in the protective layer composition as well. Typical optional ingredients include light attenuating compounds, surfactants, catalysts, crosslinkers, and adhesion promoters.

With respect to the preferred photoresists, commercially available photoresists do not form a 20- to 150-nm thick film. Rather, they must be thinned in order to meet the above-described requirements. Thinning of the photoresist is preferably accomplished with organic solvents such as ethyl lactate, PGME, PnP, PGMEA, and/or 2-heptanone in sufficient amounts to obtain the solids contents described herein.

The thin photoresist provides a number of important advantages to the photolithographic process. First, there are no outstanding photoresist patterns in the entire process. Dry etch masking is no longer required for the photoresist, making the photoresist more of a photosensitive layer rather than a photoresist. Second, the photoresist layer is so thin that transparency becomes less of a problem. Third, due to the extraordinarily thin photoresist, this invention opens an opportunity to replace the ever troubling chemically amplified photoresist with non-chemically amplified photoresists for the photolithography process of KrF or shorter wavelengths. Fourth, chances for the protective layer and photoresist patterns to collapse are significantly reduced, if not completely eliminated, due to the low aspect ratios and the excellent adhesion of the protective layers to substrates. Fifth, the thinness of the photoresist will inevitably improve the pattern resolution. Sixth, the exposure focus offset has less impact on a thin photoresist than on a thick one. Critical dimension (CD) variation of the protective layer patterns due to different DOF is less significant due to the thin photoresist.

EXAMPLES

The following examples set forth preferred methods in accordance with the invention. It is to be understood, however, that these examples are provided by way of illustration and nothing therein should be taken as a limitation upon the overall scope of the invention.

Example 1

Protective Layer Formulations

1. Preparation of Protective Layer Formulation 1

The ingredients used in this part are set forth in Table 1 below. The diketone ligand (ethyl acetoacetate), chromophore (cyano acrylate), and aminoplast crosslinking agent (Cymel®) were dissolved in one-third of the total solvent (PnP). The mixture was filtered through a membrane filter for ion removal. Then, the polydibutyltitanate and remaining two-thirds of the solvent were added. The final formulation was filtered through a particle filter.

TABLE 1

| Protective Layer Formulation 1 | |
| --- | --- |
| Polydibutyltitanate (obtained from DuPont) | 24 g |
| Ethyl acetoacetate (obtained from Lonza) | 31 g |
| Cyano acrylate (obtained from St.-Jean Photochemicals) | 6.3 g |
| Cymel ® 303LF (obtained from Cytec Industries) | 6.3 g |
| PnP (obtained from General Chemical Corp.) | 332 g |

2. Preparation of Protective Layer Formulation 2

The ingredients used in this part are set forth in Table 2 below. The diketone ligand, chromophore, and aminoplast crosslinking agent were dissolved in one-third of the total solvent (PnP). The mixture was filtered through a membrane filter for ion removal. Then, the polydibutyltitanate, photo acid generator (TAZ-108™), and remaining two-thirds of the solvent were added. The final formulation was filtered through a particle filter.

TABLE 2

| Protective Layer Formulation 2 | |
| --- | --- |
| Polydibutyltitanate | 24 g |
| Ethyl acetoacetate | 31 g |
| Cyano acrylate | 6.3 g |
| Cymel ® 303LF | 6.3 g |
| TAZ-108 (obtained from Midori Kagaku Co.) | 2.6 g |
| PnP | 332 g |

3. Preparation of Protective Layer Formulation 3

The ingredients used in this part are set forth in Table 3 below. The polydibutyltitanate, ethyl acetoacetate, and 1,1,1-tris(hydroxymethyl)ethane in Table 3 were added to a glass reactor equipped with shaft-drive stirrer, water-cooled condenser, and nitrogen sweep. The reactor was heated to 100° C. with stirring for 20 hours, then cooled to 30° C. The solvent, PnP, was finally added and mixed at room temperature.

TABLE 3

| Protective Layer Formulation 3 | |
| --- | --- |
| Polydibutyltitanate | 5.2 g |
| Ethyl acetoacetate | 6.5 g |
| 1,1,1-Tris(hydroxymethyl)ethane (obtained from Aldrich) | 1.3 g |
| PnP | 87 g |

4. Preparation of Protective Layer Formulation 4

The ingredients used in this part are set forth in Table 4 below. All the ingredients were mixed and dissolved in the solvent. The mixture was filtered through a particle filter.

TABLE 4

Protective Layer Formulation 4

| | |
|---|---|
| Polydibutyltitanate | 37 g |
| Ethyl acetoacetate | 17 g |
| 1,1,1-Tris(hydroxymethyl)ethane | 5.2 g |
| Irgacure ® 184 (obtained from Ciba Specialty Chemicals) | 26 g |
| PGMEA (obtained from Harcros Chemicals) | 722 g |

Example 2

Protective Layer Process Conditions

The protective layer formulation prepared in Part 1 of Example 1 was applied to a silicon substrate and processed under the following conditions shown in Table 5.

TABLE 5

Process Conditions

| | |
|---|---|
| Spin speed | 2000 rpm |
| Spin time | 60 sec |
| Bake temperature | 205° C. |
| Bake time | 60 sec |

Figure 2:
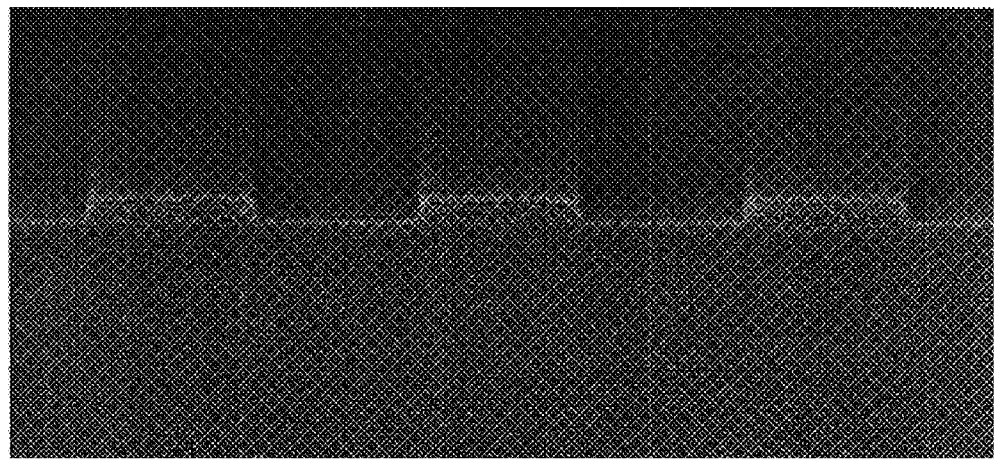
FIG. 2 is a scanning electron microscope (SEM) photograph showing the cross-sectional view of a wafer prepared according to the inventive process.

A photoresist (a non-chemically amplified photoresist, sold under the name Ultra i-123 by Shipley) was diluted with ethyl lactate at a weight ratio of 1:6 to achieve a photoresist composition having a solids content of about 2.2% by weight. The photoresist was applied to the protective layer under the following process conditions: 2000 rpm spin coat; 90° C./60 sec soft bake; 115° C./90 sec post-exposure bake (PEB). FIG. 2 shows cross-sections of dense line patterns (1:1) obtained at 365 nm (exposure dose—110 mJ/cm$^2$) on an i-line stepper (GCA Model 3300, NA 0.43) with the protective layer of this invention and the diluted photoresist thickness. The protective layer thickness was 76 nm. The photoresist and protective layer were developed with 0.26 N TMAH.

Figure 3:
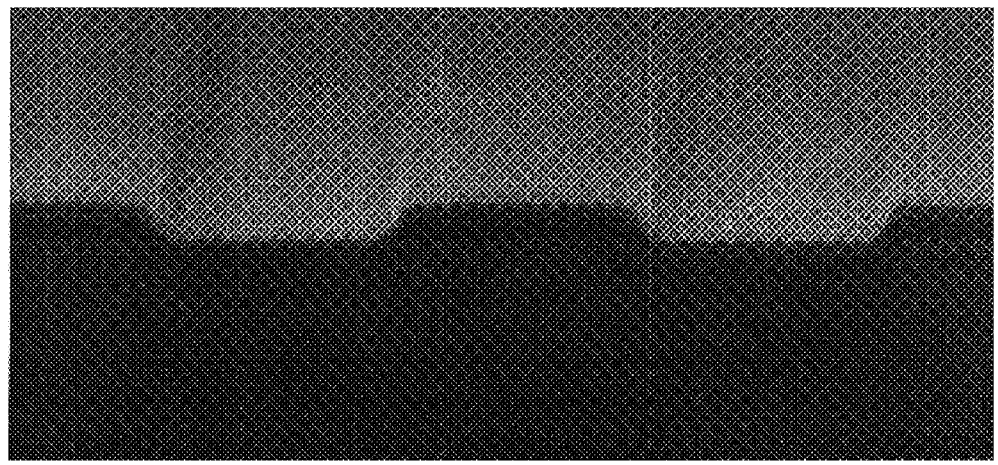
FIG. 3 is an SEM image showing a cross-sectional view of a wafer prepared according to the invention with the thinnest photoresist.

FIG. 3 shows cross-sections of line patterns (0.6 micron dense L/S (1:1)) obtained with a photoresist thickness of 24 nm (using the thinned photoresist described at the beginning of this Example). The protective layer formulation of Part 1 Example 1 was used, and the protective layer thickness was 76 nm. The process conditions were the same as those shown in Table 5. The photoresist process conditions were: 5000 rpm/60 sec spin coat; 90° C./60 sec soft bake; 115° C./90 sec PEB. The remaining conditions were the same as those discussed in the preceding paragraph with respect to FIG. 2. Clear protective layer patterns were achieved.

Figure 4:
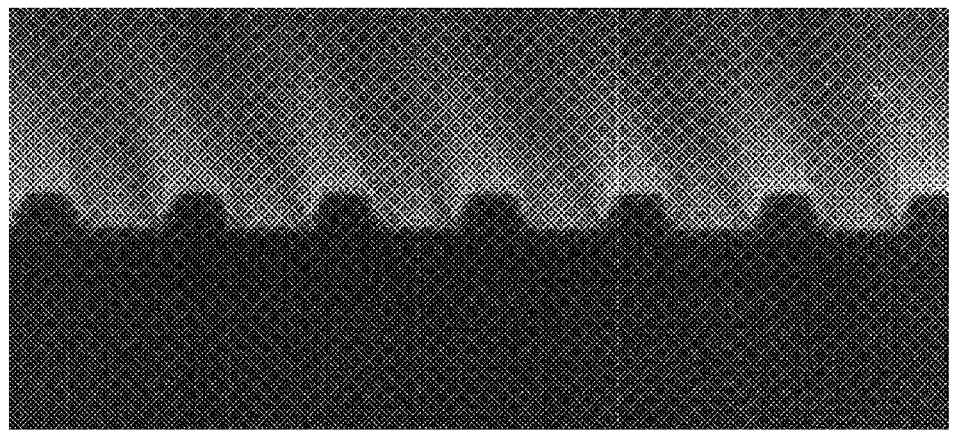
FIG. 4 is an SEM image showing a cross-sectional view of a wafer prepared according to the invention with 248-nm exposure.

FIG. 4 shows a cross-section of dense (1:1) line/space patterns obtained on a KrF stepper (Microscan III SVGL/ASML, NA=0.6, dose=47 mJ/cm$^2$). To achieve these patterns, the protective layer formulation prepared in Part 4 of Example 1 was applied and processed under the conditions shown in Table 5. A commercially available chemically amplified KrF photoresist (sold under the name UV210 by Shipley) was diluted with ethyl lactate at a weight ratio of 35:65. The diluted photoresist was applied to the protective layer at 2000 rpm/60 sec and baked at 90° C./60 sec to yield a photoresist layer having a thickness of about 100 nm. The wafer was then exposed through a photomask at a wavelength of 248 nm and baked at 130° C./90 sec. The photoresist together with the protective layer was developed with 0.26 N TMAH.

Example 3

Pattern Transfer from Protective Layer to Substrate

Figure 5:
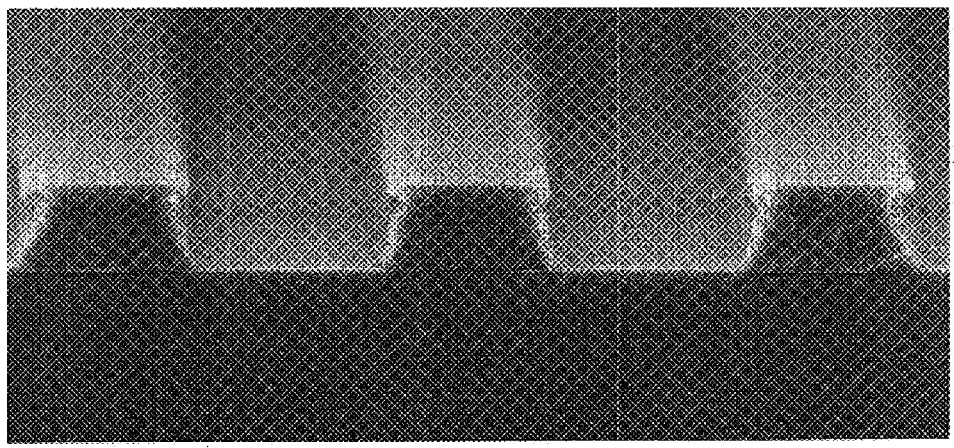
FIG. 5 is an SEM image showing a cross-sectional view of poly silicon line/space patterns fabricated according to the invention.

The protective layer formulation prepared in Part 1 of Example 1 was applied to the surface of poly silicon. The protective layer was processed with the conditions in Table 5, and yielded a protective layer with a thickness of 75 nm. A photoresist layer was applied on top of the protective layer and was subsequently baked at 90° C./60 sec to yield a photoresist layer having a thickness of about 45 nm. The photoresist layer was then exposed through a photomask at a wavelength of 365 nm and baked again at 130° C./90 sec. The exposed areas of the protective layer and photoresist were removed by a 0.26 N TMAH solution. Patterns of the protective layer and thin photoresist, similar to the results of Example 2, were obtained. The wafer with line/space patterns of the protective layer on top of 320-nm poly silicon was subjected to reactive ion etch (RE) with following conditions: chlorine (the etchant) 80 sccm; pressure 25 mTorr; and RIE power 250 W. The line/space patterns of the 75-nm protective layer were successfully transferred to the poly silicon substrate. FIG. 5 shows the etch result.

Example 4

Protective Layer Ion Implantation Barrier

Figure 6:
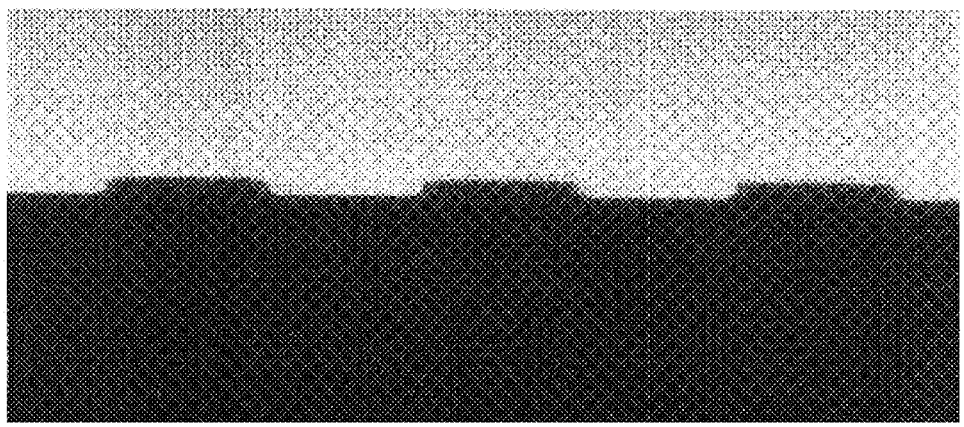
FIG. 6 is an SEM image showing a cross-sectional view of the protective layer-line/space patterns after ion implantation.

The protective layer formulation prepared in Part 1 of Example 1 was applied to a silicon substrate. The protective layer was processed with the conditions in Table 5. A photoresist was applied on top of the protective layer and subsequently baked at 90° C./60 sec to yield a photoresist having a thickness of about 45 nm. The photoresist layer was then exposed through a photomask at a wavelength of 365 nm and baked again at 130° C./90 sec. The exposed areas of the protective layer and photoresist were removed by a 0.26 N TMAH solution. The resulting patterns of the protective layer and thin photoresist were subjected to oxygen implantation at $10^{14}$ ions/cm$^2$ and 50 KeV. FIG. 6 shows the intact protective layer patterns after implantation.

Example 5

Etch Selectivities of Protective Layer Over Photoresist and Poly Silicon

The protective layer formulations prepared in Parts 1 and 3 of Example 1, together with a commercial photoresist and poly silicon substrate, were etched with oxygen and chlorine. Data in Table 6 show that the protective layers of this disclosure are truly etch barriers.

TABLE 6

Etch Rates and Parameters

| | Oxygen (sccm) | Chlorine (sccm) | RIE Power (W) | Pressure (mTorr) | Etch Rate (nm/sec) |
|---|---|---|---|---|---|
| Formulation 1 of Example 1 | | 80 | 250 | 25 | 0.035 |
| Formulation 3 | 50 | | 50 | 50 | 0.1 |

TABLE 6-continued

Etch Rates and Parameters

| | Oxygen (sccm) | Chlorine (sccm) | RIE Power (W) | Pressure (mTorr) | Etch Rate (nm/sec) |
|---|---|---|---|---|---|
| of Example 1 | | 80 | 250 | 25 | 0.029 |
| UV ™ 210[a] | 50 | | 50 | 50 | 4.9 |
| Poly silicon | | 80 | 250 | 25 | 10 |

[a]obtained from Shipley.

We claim:

1. A method of forming a precursor structure for use in microelectronic applications, said method comprising the steps of:
providing a substrate having a surface;
applying a protective layer to said substrate surface, said protective layer having an etch selectivity over a silicon substrate of from about 10-200 when chlorine or HBr is used as the etchant, and said protective layer being wet developable; and
applying a photoresist to said protective layer, said photoresist having a thickness of from about 20-100 nm.

2. The method of claim 1, further comprising the step of applying an intermediate layer to said substrate surface prior to said protective layer applying step.

3. The method of claim 2, wherein said intermediate layer is a planarizing layer.

4. The method of claim 1, wherein said protective layer has an n value of at least about 1.2 and a k value of at least about 0.

5. The method of claim 1, wherein said protective layer is photo-sensitive.

6. The method of claim 5, wherein said protective layer has an n value of at least about 1.2 and a k value of at least about 0.

7. The method of claim 1, further comprising the step of curing said protective layer.

8. The method of claim 1, further comprising the step of:
exposing at least a portion of said photoresist to activating radiation; and
developing said exposed photoresist.

9. The method of claim 8, wherein:
said protective layer has an initial solubility in a base developer;
said exposing step further comprises exposing at least a portion of said protective layer to activating radiation; and
said exposed protective layer portion has a final solubility in a base developer, said final solubility being greater than said initial solubility.

10. The method of claim 8, wherein said developing step comprises developing said exposed photoresist with an aqueous developer.

11. The method of claim 10, wherein said developing step results in the removal of said protective layer from areas adjacent said exposed portion of said photoresist.

12. The method of claim 10, wherein said aqueous developer is selected from the group consisting of tetramethyl ammonium hydroxide and KOH developers.

13. The method of claim 1, wherein said substrate has a hole formed therein, said hole being defined by a bottom wall and sidewalls, and said applying step comprises applying said protective layer to at least a portion of said bottom wall and sidewalls.

14. The method of claim 1, further including the step of baking said protective layer, after said protective layer applying step, at a temperature of from about 130-250° C.

15. The method of claim 1, wherein said protective layer has a thickness of from about 20-150 nm.

16. The method of claim 1, wherein said photoresist is formed from a composition comprising less than about 5% by weight solids, based upon the total weight of the composition taken as 100% by weight.

17. The method of claim 1, wherein said protective layer comprises:
a solvent system; and
a polymer dispersed or dissolved in said solvent system, said polymer including recurring units having the formula

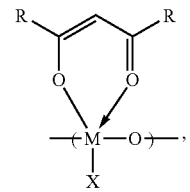

wherein X is selected from the group consisting of light-attenuating moieties and polyols, M is a metal, and each R is individually selected from the group consisting of hydrogen, alkyls, aryls, alkoxys, and phenoxys.

18. The method of claim 1, wherein said substrate is selected from the group consisting of silicon, polysilicon, silicon oxide, silicon nitride, silicon oxynitride, gallium arsenide, aluminum, tungsten, titanium, titanium-tungsten, nickel, copper, and gold substrates.

19. The method of claim 1, wherein said protective layer comprises a composition including a polymeric metal alkoxide.

20. A method of forming a precursor structure for use in microelectronic applications, said method comprising the steps of:
providing a substrate having a surface;
applying a protective layer to said substrate surface;
applying a photoresist to said protective layer, said photoresist having a thickness of less than about 150 nm;
exposing at least a portion of said photoresist and at least a portion of said protective layer to activating radiation;
contacting said exposed photoresist and protective layer portions with an aqueous developer so as to remove said portions and form a pattern in said photoresist and protective layer; and
etching said pattern into said substrate, said photoresist being removed during said etching.

* * * * *